United States Patent
Ohsuka et al.

(10) Patent No.: US 12,371,798 B2
(45) Date of Patent: *Jul. 29, 2025

(54) REGENERATING METHOD OF REMOVAL LIQUID AND REGENERATED REMOVAL LIQUID PRELIMINARY

(71) Applicants: SUMITOMO ELECTRIC INDUSTRIES, LTD., Osaka (JP); SUMITOMO ELECTRIC PRINTED CIRCUITS, INC., Shiga (JP); MEC COMPANY LTD., Hyogo (JP)

(72) Inventors: Ryuta Ohsuka, Osaka (JP); Koji Nitta, Osaka (JP); Shoichiro Sakai, Osaka (JP); Yoshihito Yamaguchi, Shiga (JP); Masaharu Yasuda, Osaka (JP); Akira Tsuchiko, Osaka (JP); Koji Kasuya, Osaka (JP); Kenji Nishie, Hyogo (JP); Yu Fukui, Hyogo (JP)

(73) Assignees: SUMITOMO ELECTRIC INDUSTRIES. LTD., Osaka (JP); SUMITOMO ELECTRIC PRINTED CIRCUITS, INC, Shiga (JP); MEC COMPANY LTD., Hyugo (JP)

( * ) Notice: Subject to any disclaimer, the term of this patent is extended or adjusted under 35 U.S.C. 154(b) by 314 days.

This patent is subject to a terminal disclaimer.

(21) Appl. No.: 17/998,980

(22) PCT Filed: Nov. 16, 2021

(86) PCT No.: PCT/JP2021/042118
§ 371 (c)(1),
(2) Date: Nov. 16, 2022

(87) PCT Pub. No.: WO2022/113832
PCT Pub. Date: Jun. 2, 2022

(65) Prior Publication Data
US 2023/0212757 A1    Jul. 6, 2023

(30) Foreign Application Priority Data
Nov. 24, 2020   (JP) .................................. 2020-194326

(51) Int. Cl.
*C23F 1/46*    (2006.01)
*H05K 3/06*    (2006.01)

(52) U.S. Cl.
CPC    *C23F 1/46* (2013.01); *H05K 3/06* (2013.01)

(58) Field of Classification Search
CPC ..................................... C23F 1/46; H05K 3/06

USPC ................................................ 216/93; 438/93
See application file for complete search history.

(56) References Cited

U.S. PATENT DOCUMENTS

| | | | |
|---|---|---|---|
| 12,144,122 B2 * | 11/2024 | Sakai ...................... | C22C 19/05 |
| 2011/0278261 A1 | 11/2011 | Himi et al. | |
| 2020/0156961 A1 * | 5/2020 | Mettry .................... | C02F 1/286 |
| 2020/0340132 A1 * | 10/2020 | Llavona-Serrano ..... | C25D 3/38 |

FOREIGN PATENT DOCUMENTS

| | | | | |
|---|---|---|---|---|
| AU | 2015252110 A1 * | 11/2015 | ............... | C07K 1/18 |
| CN | 111020584 A  * | 4/2020 | ............... | C23F 1/18 |
| JP | 2004-006773 | 1/2004 | | |
| JP | 2011-236467 | 11/2011 | | |
| JP | 2013-188720 | 9/2013 | | |
| JP | 2014-075490 | 4/2014 | | |

OTHER PUBLICATIONS

Wikipedia, Dipicolylamine (Year: 2009).*
U.S. Appl. No. 17/998,966, filed Nov. 16, 2022.
Notice of Allowance mailed on Sep. 16, 2024 with respect to the related U.S. Appl. No. 17/998,966.

* cited by examiner

*Primary Examiner* — Duy Vu N Deo
(74) *Attorney, Agent, or Firm* — IPUSA, PLLC

(57) ABSTRACT

A regenerating method of a removal liquid including: removing a nickel-chromium-containing layer from a substrate using the removal liquid at a time of manufacturing a printed circuit board by a semi-additive method, the substrate including the nickel-chromium-containing layer and a copper-containing layer; collecting the removal liquid that has been used; and contacting the collected removal liquid in collecting the removal liquid with a chelate resin, wherein the chelate resin includes a functional group represented by a following formula (1):

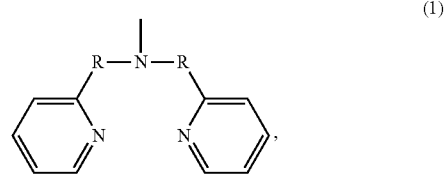

(1)

where a plurality of Rs are identical divalent hydrocarbon groups having 1 to 5 carbons, and a portion of hydrogen atoms in the hydrocarbon groups are substituted with halogen atoms or not substituted with a halogen atom.

3 Claims, No Drawings

REGENERATING METHOD OF REMOVAL LIQUID AND REGENERATED REMOVAL LIQUID PRELIMINARY

TECHNICAL FIELD

The present disclosure relates to a regenerating method of a removal liquid and a regenerated removal liquid.

The present application is based on and claims priority to Japanese Application No. 2020-194326 filed on Nov. 24, 2020, the contents of which are incorporated herein by reference in their entirety.

BACKGROUND ART

With reduction in size and weight of electronic devices, wiring portions of printed circuit boards have been reduced in size. As a method of reducing the size of a wiring portion of a printed circuit board, for example, a seed layer is formed on a surface of an insulating resin layer, a portion other than a portion forming a circuit is covered with a plating resist, and a metal layer is selectively formed only on the circuit portion by electroplating. Then, after removing the plating resist, the seed layer other than the circuit portion is removed using a seed layer removal liquid, and a printed circuit board is formed (see Japanese Laid-Open Patent Publication No. 2004-6773).

CITATION LIST

Patent Literature

[PTL 1]
Japanese Laid-Open Patent Publication No. 2004-6773

SUMMARY OF INVENTION

According to one aspect of the present disclosure, a regenerating method of a removal liquid includes: removing a nickel-chromium-containing layer from a substrate using the removal liquid at a time of manufacturing a printed circuit board by a semi-additive method, the substrate including the nickel-chromium-containing layer and a copper-containing layer; collecting the removal liquid that has been used; and contacting the collected removal liquid in collecting the removal liquid with a chelate resin, wherein the chelate resin includes a functional group represented by a following formula (1).

[Chem 1]

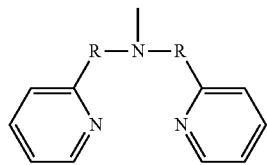

(1)

(In formula (1), the Rs are identical divalent hydrocarbon groups having 1 to 5 carbons. A portion of the hydrogen atoms in the hydrocarbon groups may be substituted with halogen atoms.)

DESCRIPTION OF EMBODIMENTS

Technical Problem

For example, when manufacturing a printed circuit board, a seed layer is formed on a substrate, and a copper plating layer and the like is laminated on the seed layer. Examples of the seed layer include a layer containing nickel and chromium. The seed layer is partially removed during manufacturing using, typically, a nickel-chromium-containing layer removal liquid. The nickel-chromium-containing layer removal liquid is a liquid that removes the nickel-chromium-containing layer. Hereinafter, the nickel-chromium-containing layer removal liquid may be simply referred to as a removal liquid. The removal liquid cannot be used repeatedly. This is because when the seed layer is immersed in the removal liquid, the metal components of other layers of the printed circuit board dissolve in the removal liquid, the metal concentration in the removal liquid increases, and as a result, the etching performance deteriorates.

In particular, when a fine printed circuit board is manufactured, deterioration of etching performance causes peeling of wiring portions, and as a result, the performance of circuit board is affected.

The present disclosure is made based on such circumstances, and an object of the present disclosure is to provide a regenerating method of removal liquid that can extend the life of the removal liquid and can avoid the peeling of the wiring portion when the regenerated removal liquid is used for manufacturing the printed circuit board.

Advantageous Effects of Invention

According to the present disclosure, the life of the removal liquid can be extended, and it is possible to manufacture the regenerated removal liquid that can prevent the peeling of the wiring portion when used for manufacturing the printed circuit board.

DESCRIPTION OF EMBODIMENT OF PRESENT DISCLOSURE

First, embodiments of the present disclosure will be listed and described.

A regenerating method of a removal liquid includes: removing a nickel-chromium-containing layer from a substrate including the nickel-chromium-containing layer and a copper-containing layer using a removal liquid, at a time of manufacturing a printed circuit board by a semi-additive method; collecting the removal liquid that has been used; contacting the removal liquid that has been collected in collecting the removal liquid with a chelate resin, wherein the chelate resin includes a functional group represented by a following formula (1).

[Chem 2]

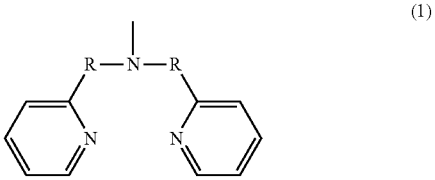

(1)

(In formula (1), the Rs are identical divalent hydrocarbon groups having 1 to 5 carbons. A portion of the hydrogen atoms in the hydrocarbon groups may be substituted with halogen atoms.)

The removal liquid used for removing the nickel-chromium-containing layer typically includes hydrochloric acid, sulfuric acid, and the like. In addition to nickel and chromium, copper in the wiring portion also slightly dissolves in the removal liquid. The higher the concentration of copper ions in the liquid, the faster the copper dissolves. Therefore, the lifetime of the removal liquid is determined by the concentration of copper ions in the removal liquid. The inventors of the present invention considered that it is necessary to maintain the concentration of copper ions in the removal liquid at a low level in order to extend the life of the removal liquid and to prevent the peeling of the manufactured circuit, and conducted an intensive investigation. As a result, it was found that, by contacting the removal liquid with a chelate resin having a functional group represented by the above formula (1), the copper ions in the removal liquid can be adsorbed by the chelate resin. In the regenerating method of the removal liquid, the removal liquid that has been used is collected and contacted with a chelate resin including a functional group represented by the above formula (1). Accordingly, the concentration of the copper ions in the regenerated removal liquid is reduced. Because the concentration of the copper ions in the regenerated removal liquid is reduced, it is possible to improve the effect of removing the nickel-chromium-containing layer while preventing the progress of dissolution of the copper contained in the wiring portion in the step of removing the nickel-chromium-containing layer. As a result, peeling of the wiring portion can be prevented.

Preferably, the functional group is a bis(2-pyridylmethyl) amino group. When the chelate resin includes a functional group represented by above formula (1), the effect of removing the nickel-chromium-containing layer can be further improved.

According to another embodiment of the present disclosure, a regenerated removal liquid used in a semi-additive method obtained by the regenerating method is provided. It is preferable that the regenerated removal liquid contains a pyridine-based compound, and the concentration of the pyridine-based compound is more than 0 ppm and 5,000 ppm or less. The regenerated removal liquid has a good effect of removing the nickel-chromium-containing layer.

It is preferable that, in the regenerated removal liquid, chloride ions and copper ions are contained, the pH is 1 or less, and the concentration of the copper ions is 1 ppm or more and 2,000 ppm or less. The regenerated removal liquid can further improve effect of removing the nickel-chromium-containing layer.

DETAILS OF EMBODIMENTS OF PRESENT DISCLOSURE

Hereinafter, a method of manufacturing a printed circuit board according to an embodiment of the present disclosure will be described in detail with reference to the drawings.
Regenerating Method of Removal Liquid The regenerating method of removal liquid according to the present disclosure includes: removing a nickel-chromium-containing layer from a substrate including the nickel-chromium-containing layer and a copper-containing layer using a removal liquid, at a time of manufacturing a printed circuit board by a semi-additive method; collecting the removal liquid that has been used; and contacting the removal liquid that has been collected in collecting the removal liquid with a chelate resin, wherein the chelate resin includes a functional group represented by a following formula (1). "Removing a nickel-chromium-containing layer from a substrate including the nickel-chromium-containing layer and a copper-containing layer using a removal liquid" may be referred to as "removing a nickel-chromium-containing layer". "Collecting the removal liquid that has been used" may be referred to as "collecting an removal liquid that has been used". "Contacting the removal liquid that has been collected in collecting the removal liquid with a chelate resin" may be referred to as "Contacting the removal liquid that has been collected with a chelate resin".

[Chem 3]

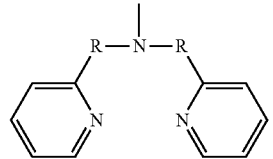

(1)

(In formula (1), the Rs are identical divalent hydrocarbon groups having 1 to 5 carbons. A portion of the hydrogen atoms in the hydrocarbon groups may be substituted with halogen atoms.)
(Removing Nickel-Chromium-Containing Layer)

This step is performed in the step of manufacturing a printed circuit board by a semi-additive method. The substrate including the nickel-chromium-containing layer and the copper-containing layer is not particularly limited as long as the substrate includes at least the nickel-chromium-containing layer and the copper-containing layer. The substrate is a substrate in the middle of manufacturing a printed circuit board by the semi-additive method. The substrate may be manufactured, for example, by the following method.

First, a base film is prepared. The base film is, for example, polyimide, polyethylene terephthalate, liquid crystal polymer, fluoropolymer, and the like. A nickel-chromium-containing layer is laminated on the base film. Examples of laminating method include electroless plating, sputtering, deposition, coupling agent coating, and the like. A conductive layer containing copper is laminated on the nickel-chromium-containing layer. Examples of laminating method of the conductive layer include electroless plating, coating, drying, and sintering of a dispersion liquid of fine metal particles, sputtering, deposition, and the like. Next, a resist film with an opening corresponding to the wiring pattern is laminated on the conductive layer. Examples of the method of laminating the resist film include a method of coating and drying a liquid resist composition, a method of thermocompression bonding of a sheet resist composition, and the like. The sheet resist composition is, for example, a dry film. Next, a copper plating layer is formed on the conductive layer exposed from the opening of the resist film. Then, the resist film is removed. The resist film may be removed using, for example, a conventional removal liquid mainly containing 2-amine ethanol, tetramethylammonium hydroxide, organic acid, and the like. Then, the conductive layer exposed by the removal of the resist film is removed. The conductive layer may be removed using, for example, an aqueous solution of sulfuric acid and hydrogen peroxide.

The aqueous solution of sulfuric acid and hydrogen peroxide may be also called a piranha solution.

The substrate thus obtained is a substrate having at least a nickel-chromium-containing layer and a copper-containing layer thereon.

Next, the nickel-chromium-containing layer is removed from the substrate including the nickel-chromium-containing layer and the copper-containing layer using the removal liquid. Here, the nickel-chromium-containing layer is dissolved and removed using a removal solution that erodes nickel and chromium. A method of dissolving may be, for example, storing the removal liquid in a liquid bath and immersing the substrate in the removal liquid.

Preferably, an unused removal liquid contains chloride ions and has a pH of 1 or less. By removing the nickel-chromium-containing layer under strongly acidic conditions where the pH of the removal liquid is 1 or less, the effect of removing the nickel-chromium-containing layer can be further improved. As the strong acid component, hydrochloric acid is preferred. Specifically, an aqueous solution of hydrochloric acid having a concentration of 5% by mass or more and 20% by mass or less is preferred.

As the removal liquid to be used, an unused removal liquid or a regenerated removal liquid described later may be used. Alternatively, the unused removal liquid, the regenerated removal liquid, and the removal liquid that has been used may be used in any combination.

In the step of removing the nickel-chromium-containing layer, removing by dissolution of the nickel-chromium-containing layer is performed.

(Collecting Removal Liquid that has been Used)

In this step, the removal liquid that has been used (hereinafter, also referred to as an "used removal liquid") is collected. In the used removal liquid, the concentration of copper ions is higher than that of an unused removal liquid because copper in the copper-containing layer dissolves. The higher the concentration of copper ions in the removal liquid, the faster the copper dissolves. Therefore, the lifetime of the removal liquid is determined by the concentration of copper ions in the removal liquid. In view of this, after the step of obtaining the used removal liquid in accordance with the present disclosure, the step of measuring the concentration of copper ions in the used removal liquid may optionally be included. When a measurement result indicates that the concentration of copper ions is lower than a predetermined concentration, the used removal liquid may be reused as is. When the concentration of copper ions is higher than a predetermined concentration, the removal liquid may be regenerated in the subsequent step. In the step of collecting the removal liquid of the nickel-chromium-containing layer, the removal liquid described above is collected.

(Contacting Removal Liquid that has been Collected with Chelate Resin)

In this step, the used removal liquid collected in the collecting step is contacted with the chelate resin to regenerate the used removal liquid.

The chelate resin includes a functional group represented by formula (1) described below. By contacting the removal liquid with the chelate resin, the copper ions in the removal liquid can be adsorbed, so that the concentration of copper ions in the resulting regenerated removal liquid can be maintained at a low level. Therefore, it is possible to increase the lifetime of the removal liquid and to improve the effect of removing the nickel-chromium-containing layer, while preventing the progress of dissolution of the copper contained in the wiring portion in the step of removing the nickel-chromium-containing layer. In addition, even in the case of manufacturing a fine printed circuit board, peeling of the wiring portion can be prevented.

[Chem 4]

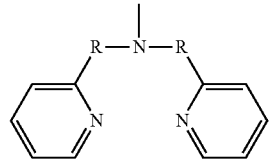

(1)

In formula (1), the Rs are identical divalent hydrocarbon groups having 1 to 5 carbons. A portion of the hydrogen atoms in the hydrocarbon groups may be substituted with halogen atoms.

Examples of the divalent hydrocarbon group having 1 to 5 carbons represented by R include a divalent chain hydrocarbon group having 1 to 5 carbons and a divalent alicyclic hydrocarbon group having 3 to 5 carbons. The chain hydrocarbon group may also be linear or branched.

Examples of the divalent chain hydrocarbon group include a divalent chain saturated hydrocarbon group, a divalent chain unsaturated hydrocarbon group, and the like.

Examples of the divalent chain saturated hydrocarbon group include a methanediyl group ($-CH_2-$), an ethanediyl group ($-C_2H_4-$), a propanediyl group ($-C_3H_6-$), a butanediyl group ($-C_4H_8-$), a dimethylethanediyl group ($-C_4H_8-$), a dimethyl methanediyl group ($-C_3H_6-$), a methyl ethanediyl group ($-C_3H_6-$), and the like.

Examples of the divalent unsaturated hydrocarbon group include an ethenediyl group ($-C_2H_2-$), a propenediyl group ($-C_3H_4-$), a butenediyl group ($-C_4H_6-$), a methylenemethanediyl group ($-C_2H_4-$), a methyleneethanediyl group ($-C_3H_4-$), a methylenepropanediyl group ($-C_4H_6-$), an ethylideneethanediyl group ($-C_4H_6-$), an ethynediyl group ($-C_2H_2-$), a propynediyl group ($-C_3H_2-$), a butynediyl group ($-C_4H_4-$), a vinylethynyl group ($-C_4H_2-$), an ethynylpropenediyl group ($-C_5H_4-$), a pentadiynediyl group ($-C_5H_2-$), and the like.

Examples of the divalent alicyclic hydrocarbon group include a divalent alicyclic saturated hydrocarbon group, a divalent alicyclic unsaturated hydrocarbon group, and the like.

Examples of the divalent alicyclic saturated hydrocarbon group include a cyclopropanediyl group ($-C_3H_4-$), a cyclobutanediyl group ($-C_4H_6-$), a cyclopentanediyl group ($-C_5H_8-$), and the like.

Examples of the divalent alicyclic unsaturated hydrocarbon group include a cyclopentenediyl group ($-C_5H_6-$), and the like.

Examples of the halogen atom which may substitute a portion of the hydrogen atoms in the hydrocarbon group include fluorine atom, chlorine atom, bromine atom, and iodine atom.

Preferably, the functional group is a bis(2-pyridylmethyl) amino group. When the chelate resin includes a functional group represented by above formula (1), the effect of removing the nickel-chromium-containing layer can be further improved.

As a base material of the chelate resin, for example, polystyrene, a styrene-divinylbenzene copolymer, and the like may be used. When the chelate resin described above is used, the effect of reducing copper ions in the removal liquid that has been used is excellent.

As a method of contacting the chelate resin with the removal liquid that has been used, a publicly-known method using a chelate resin column can be used, for example. The chelate resin column is filled with the chelate resin. Then, the removal liquid that has been used is poured into the chelate resin column to remove copper ions from the removal liquid for removing the containing layer that has been used.

As another method of contacting the chelate resin with the regenerated removal liquid that has been used, the chelate resin may be directly added into the regenerated removal liquid that has been used without using the chelate resin tower, and the chelate resin may be removed by filtration after a predetermined period of time.

It is preferable that the amount of the chelate resin is 50 L or more and 200 L or less for 200 L of the removal liquid that has been used.

The regenerated removal liquid obtained after this step may be returned to the step of removing the nickel-chromium-containing layer. In this case, the step of removing, the step of regenerating, and the step of contacting may be repeatedly performed for the same substrate to circulate the regenerated removal liquid. Alternatively, the regenerated removal liquid may be used in the step of removing the nickel-chromium-containing layer of other substrate that may be subsequently performed.

<Regenerated Removal Liquid>

The regenerated removal liquid according to the present disclosure is obtained by the regeneration method of the removal liquid. The regenerated removal liquid preferably contains a pyridine-based compound, and the concentration of the pyridine-based compound is more than 0 ppm and 5,000 ppm or less. When the concentration of the pyridine-based compound is in the range described above, the effect of removing the nickel-chromium-containing layer is good.

When the chelate resin includes a functional group represented by above formula (1), a small amount of the pyridine-based compound derived from the functional group described above may be formed in the regenerated removal liquid. The pyridine-based compound is a compound which is formed by decomposition of the chelate resin including the functional group. It is preferable that the concentration of the pyridine-based compound in the regenerated removal liquid is 0 ppm, or more than 0 ppm and 5,000 ppm or less. The presence of the pyridine-based compound in the regenerated removal liquid inhibits the removal of nickel and chromium. Therefore, by setting the concentration of the pyridine-based compound to the range described above, the effect of inhibiting the removal of nickel and chromium by the pyridine-based compound can be reduced.

It is preferable that, in the regenerated removal liquid, chloride ions and copper ions are further contained, the pH is 1 or less, and the concentration of the copper ions is 1 ppm or more and 2,000 ppm or less. When the regenerated removal liquid has a strong acidity of pH 1 or less, the effect of removing the nickel-chromium-containing layer containing nickel and chromium can be further improved. Further, when the concentration of the copper ions of the regenerated removal liquid is in the range described above, the effect of removing the nickel-chromium-containing layer is good.

The regenerated removal liquid according to the present disclosure may be used as the removal liquid in removing the nickel-chromium-containing layer from the substrate including the nickel-chromium-containing layer and the copper-containing layer, in the semi-additive method. The method of removing may be similar to, for example, the method described above (the step of removing the nickel-chromium-containing layer). The regenerated removal liquid may be used by mixing with the unused removal liquid or with the used removal liquid.

Other Embodiments

The embodiments disclosed herein should be considered to be illustrative in all respects and not restrictive. The scope of the present disclosure is not limited to the configuration of the embodiments described above, but is set forth by the appended claims, and is intended to include all modifications within the meaning and scope equivalent to the claims.

EXAMPLE

Although the present disclosure will be described in further detail below by way of example, the present disclosure is not limited to these examples.

[No. 1 to No. 10]

Hereinafter, removal liquids No. 1 to No. 10 were manufactured, and the performance of removing the nickel-chromium-containing layer in the printed circuit board was evaluated.

First, a base film consisting of a polyimide film with an average thickness of 25 µm was provided. In the present disclosure, "average thickness" refers to an average value of the thickness measured at freely-selected five points. A conductive pattern that includes 500 wiring portions arranged in parallel was formed on both sides of the base film by a semi-additive method. Specifically, first, a nickel-chromium-containing layer having an average thickness of 4 nm composed of nickel and chromium was laminated. Then, a conductive layer having an average thickness of 0.2 µm composed of copper was laminated. Next, a photoresist film was laminated on substantially the entire surface of the conductive layer by thermocompression bonding of an acrylic dry film resist. Then, by selectively exposing the photoresist film with a photomask, a portion that dissolves in a developing liquid and a portion that does not dissolve in the developing liquid were formed on the photoresist film. Next, the portion that dissolves in the developing liquid was washed out using the developing liquid, so that the resist pattern having an opening corresponding to the formed region of a plurality of wiring portions is laminated.

Then, a metal layer having an average thickness of 10 µm was laminated by subjecting the surface of the conductive layer after laminating the resist pattern to electrolytic copper plating in a copper sulfate plating bath at 25° C. containing 90 g/L of copper sulfate pentahydrate.

Then, after the metal layer was laminated, the resist pattern was removed using a resist removal liquid. The conductive layer in the region where the metal layer is not laminated was removed using a conductive layer removal liquid.

Then, the exposed nickel-chromium-containing layer was removed. The composition of the unused removal liquid was 15% hydrochloric acid, 10% sulfuric acid, a copper ion concentration of 50 ppm, and a pH of 1 or less. In order to remove the nickel-chromium-containing layer, the substrate was immersed in the unused removal liquid at a liquid temperature of 45° C. The treatment time for removing the nickel-chromium-containing layer was 30 seconds.

Then, in order to contact the used removal liquid and the chelate resin, 50 L of a resin was filled into a chelate resin column, and the used removal liquid was passed at 10 L/min.

As the chelate resin, three types of chelate resins having a bis(2-pyridylmethyl)amino group, an iminodiacetic acid group, and an aminophosphate group, respectively, were used. The pH of the obtained regenerated removal liquid was set to 1 or less in all cases.

As for the concentration of copper ions in the regenerated removal liquid, the concentration of copper ions in a sample liquid was quantified using an inductively coupled plasma (ICP) emission spectrometer.

The concentration of the pyridine-based compound in the regenerated removal liquid was determined as follows. The sample liquid was diluted with water and the absorbance at 263 nm was measured using an ultraviolet-visible spectrophotometer UV-1800 manufactured by Shimadzu Corporation. The concentration of the pyridine-based compound in the regenerated removal liquid was calculated from the calibration curve of bis(2-pyridylmethyl)amine prepared in advance.

The concentration of copper ions and the concentration of the pyridine-based compound in the regenerated removal liquid was changed by adjusting the concentration of copper ions in the used removal liquid and the number of times the used removal liquid was passed through the chelate resin column. Table 1 illustrates the concentration of copper ions and the pyridine-based compound in the regenerated removal liquid obtained (No. 2 to No. 10). As an unused liquid, the unused removal liquid having a composition of 15% hydrochloric acid, 10% sulfuric acid, a copper ion concentration of 50 ppm, and a pH of 1 or less, was used.

Next, among the steps of manufacturing the printed circuit board, up to the step of removing the conductive layer was performed, and printed circuit boards are obtained for the regenerated removing liquid of No. 2 to No. 10. The line and space of the printed circuit board was 10 μm/10 μm. The nickel-chromium-containing layer in the region where the metal layer is not laminated was removed from the obtained printed circuit board using only a removal liquid having a composition described in Table 1. In the step of removing the nickel-chromium-containing layer, the substrate was immersed in the regenerated removal liquid at a liquid temperature of 45° C. The treatment time for removing the nickel-chromium-containing layer was 30 seconds.

[Evaluation]
(Peeling Occurrence Rate of Wiring Portion)

For the printed circuit boards in which the nickel-chromium-containing layer was removed using the removal liquid of No. 1 to No. 10, the short circuit occurrence rate [%] due to the nickel-chromium-containing layer residue was determined by detecting the number of peeling occurrences by visual inspection.

(Short Circuit Occurrence Rate Due to Nickel-Chromium-Containing Layer Residue)

For the printed circuit boards in which the nickel-chromium-containing layer was removed using the removal liquid of No. 1 to No. 10, the short circuit occurrence rate [%] due to the nickel-chromium-containing layer residue was determined by detecting the number of short circuit occurrences by electrical inspection.

Table 1 describes the evaluation results of the peeling occurrence rate of the wiring portion and the short circuit occurrence rate due to the nickel-chromium-containing layer residue. Regarding the pyridine-based compound concentration, "<10" indicates that the concentration is below the detection limit (10 ppm).

TABLE 1

| TEST NUMBER | REGENERATED REMOVAL LIQUID | | | EVALUATION | |
|---|---|---|---|---|---|
| | FUNCTIONAL GROUP OF CHELATE RESIN | COPPER ION CONCENTRATION [ppm] | PYRIDINE-BASED COMPOUND CONCENTRATION [ppm] | PEELING OCCURRENCE RATE OF WIRING PORTION [%] | SHORT CIRCUIT OCCURRENCE RATE DUE TO NICKEL-CHROMIUM-CONTAINING LAYER RESIDUE [%] |
| No. 1 UNUSED LIQUID (REFERENCE EXAMPLE) | — | — | — | 0 | 0 |
| No. 2 | BIS (2-PYRIDYLMETHYL) AMINO GROUP | 2000 | <10 | 0 | 0 |
| No. 3 | BIS (2-PYRIDYLMETHYL) AMINO GROUP | 2500 | <10 | 20 | 0 |
| No. 4 | BIS (2-PYRIDYLMETHYL) AMINO GROUP | 50 | 5000 | 0 | 0 |
| No. 5 | BIS (2-PYRIDYLMETHYL) AMINO GROUP | 2000 | 5000 | 0 | 0 |
| No. 6 | BIS (2-PYRIDYLMETHYL) AMINO GROUP | 0 | 5000 | 0 | 4 |
| No. 7 | BIS (2-PYRIDYLMETHYL) AMINO GROUP | 2000 | 6500 | 0 | 14 |

TABLE 1-continued

| TEST NUMBER | REGENERATED REMOVAL LIQUID | | | EVALUATION | |
| --- | --- | --- | --- | --- | --- |
| | FUNCTIONAL GROUP OF CHELATE RESIN | COPPER ION CONCENTRATION [ppm] | PYRIDINE-BASED COMPOUND CONCENTRATION [ppm] | PEELING OCCURRENCE RATE OF WIRING PORTION [%] | SHORT CIRCUIT OCCURRENCE RATE DUE TO NICKEL-CHROMIUM-CONTAINING LAYER RESIDUE [%] |
| No. 8 | BIS (2-PYRIDYLMETHYL) AMINO GROUP | 2500 | 6500 | 17 | 9 |
| No. 9 | IMINODIACETIC ACID GROUP | 3500 | 0 | 47 | 0 |
| No. 10 | AMINOPHOSPHATE GROUP | 3500 | 0 | 44 | 0 |

As described in Table 1, when the nickel-chromium-containing layer is removed using the regenerated removal liquids (No. 2 to No. 8) regenerated with the chelate resin having a bis(2-pyridylmethyl)amino group, a peeling occurrence rate of the wiring portion was low, and the results were good. In particular, in No. 2, No. 4, and No. 5, no peeling of the wiring portion and no short circuit due to the nickel-chromium-containing layer residue were observed, as in the case of using the unused liquid of No. 1. In No. 2, No. 4, and No. 5, the concentration of copper ions in the regenerated removal liquid is 50 ppm or more and 2000 ppm or less, and the concentration of the pyridine-based compound is 5,000 ppm or less.

In contrast, when the regenerated removal liquids (No. 9 and No. 10) regenerated with the chelate resin having an iminodiacetic acid group or an aminophosphate group were used, a peeling occurrence rate of the wiring portion was high.

As described above, according to the regenerating method of a removal liquid according to the present disclosure, the concentration of copper ions in the regenerated removal liquid can be maintained at a low level. Thus, it is possible to prevent the progress of the copper dissolution contained in the wiring portion in the step of removing the nickel-chromium-containing layer while improving the effect of removing the nickel-chromium-containing layer. Accordingly, it is demonstrated that a printed circuit board capable of extending the life of the removal liquid and preventing the peeling of the wiring portion can be obtained even when a fine printed circuit board is manufactured.

The invention claimed is:

1. A regenerating method of a removal liquid comprising:
removing a nickel-chromium-containing layer from a substrate using the removal liquid at a time of manufacturing a printed circuit board by a semi-additive method, the substrate including the nickel-chromium-containing layer and a copper-containing layer;
collecting the removal liquid that has been used; and
contacting the collected removal liquid in collecting the removal liquid with a chelate resin,
wherein the chelate resin includes a functional group represented by a following formula (1):

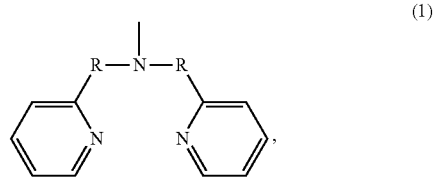

(1)

where a plurality of Rs are identical divalent hydrocarbon groups having 1 to 5 carbons, and some of hydrogen atoms in the hydrocarbon groups are substituted with halogen atoms or not substituted with a halogen atom.

2. The regenerating method according to claim 1, the functional group is a bis(2-pyridylmethyl)amino group.

3. A regenerated removal liquid used in a semi-additive method obtained by the regenerating method according to claim 1, the regenerated removal liquid comprising:
a pyridine-based compound that includes the functional group represented by the following formula (1):

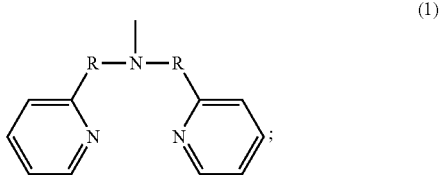

(1)

chloride ions; and
copper ions, wherein
the pyridine-based compound is present at a concentration of more than 0 ppm and 5,000 ppm or less,
the copper ions are present at a concentration of 1 ppm or more and 2,000 ppm or less, and
a pH of the regenerated removal liquid is 1 or less.

* * * * *